US005793252A

United States Patent [19]
Smith

[11] Patent Number: 5,793,252
[45] Date of Patent: Aug. 11, 1998

[54] POWER AMPLIFIER WITH SWITCHABLE VOICING ELEMENTS

[75] Inventor: Randall C. Smith, Petaluma, Calif.

[73] Assignee: Mesa Boogie, Limited, Petaluma, Calif.

[21] Appl. No.: 761,364

[22] Filed: Dec. 9, 1996

Related U.S. Application Data

[60] Provisional application No. 60/008,401, Dec. 12, 1995.
[51] Int. Cl.⁶ ........................................... H03F 3/28
[52] U.S. Cl. ........................ 330/3; 330/118; 330/123
[58] Field of Search ........................... 330/3, 51, 118, 330/123, 124 R

[56] References Cited

U.S. PATENT DOCUMENTS

| | | | |
|---|---|---|---|
| 3,566,236 | 2/1971 | Johnson | 330/118 X |
| 4,532,476 | 7/1985 | Smith | 330/123 |
| 4,593,251 | 6/1986 | Smith | 330/123 |
| 5,550,509 | 8/1996 | Trentino | 330/123 X |
| 5,559,469 | 9/1996 | Smith | 330/123 |
| 5,705,950 | 1/1998 | Butler | 330/3 |

*Primary Examiner*—Steven Mottola
*Attorney, Agent, or Firm*—Jay M. Cantor

[57] ABSTRACT

An electronic amplifying apparatus for sound reproduction and musical instrument amplification including at least two pairs of power output devices which are independently switchable between triode and pentode operation. The amplifier further contains a switch apparatus to select the amount of negative feedback within the amplifier.

16 Claims, 1 Drawing Sheet

POWER AMPLIFIER WITH SWITCHABLE VOICING ELEMENTS

This application claims priority under 35 USC §119 (e) (1) of provisional application Ser. No. 60/008401, filed Dec. 12, 1995.

BACKGROUND OF THE INVENTION

1. Field of the Invention

This invention relates to a vacuum tube amplifier controllable among several conditions of operation and feedback to allow the listener to easily select the sonic characteristics most preferred for the given piece of music.

2. Brief Description of the Prior Art

Music is one of the most subjective of all areas. Enhancement of the musical experience—whether it be playing or listening—depends upon numerous subjective and objective factors, and the number of relevant factors increases greatly when the art of electronic amplification is involved.

There has long existed an unfilled need for an amplifier whose inherent sonic characteristics could easily be altered such that the user could adapt amplifier performance to suit a variety of individual musical styles as well as the needs of different speakers and acoustic environments.

In the field known as "High End Audio" where a no-compromise approach is taken in the pursuit of realistic musical reproduction, the need for an amplifier with selectable performance characteristics is especially keen. Certain amplifier types are renowned for certain abilities—but as any particular virtue becomes stronger, other characteristics often suffer in equal proportion and the universality of a given design is severely limited.

For example, in the case of vacuum tube amplifiers, low power, triode-type amplifiers with little or no negative feedback are generally favored as superior for the playback of acoustic instruments in a chamber setting. At the opposite end of the performance spectrum, high power pentode designs excel for the reproduction of modern electronic music where bass fundamentals require considerable amplifier power and substantial negative feedback is needed to provide tight control over the speakers. Large reserves of undistorted power are required to accurately reproduce complex layers of sounds especially when they include extremes of frequency and dynamic range. Yet such a high power, pentode amplifier with ample negative feedback may sound harsh and clinical when reproducing chamber music and typically will lack the lush warmth which is characteristic of the zero-feedback triode design.

Furthermore, there is a performance continuum between these two examples which, if incrementally available, would allow the listener to easily select the sonic characteristics most preferred for a given piece of music. Thus, a single amplifier could admirably fulfill the diverse roles formerly entailing either compromise or a small fleet of different amplifier types. No amplifier having such characteristics is known to exist in any form and particularly in a vacuum tube embodiment.

SUMMARY OF THE INVENTION

In accordance with the present invention, there is provided a single amplifer which is user controllable to present a performance continuum as described above to allow the listener to easily select the sonic characteristics most preferred for the given piece of music.

In the vacuum tube amplifier of the preferred embodiment of the present invention, three pairs of push-pull power output tubes are provided. One pair of these output tubes has its screen grids fed from a double-pole, double-throw (dpdt) switch such that, in one position of the switch, each screen grid is fed from its respective plate. Thus with the plate's AC component superimposed on the DC B+, so-called triode operation ensues. (It may be more accurate to say "tetrode" operation in the case of a beam power tube, but triode-like performance is the result.) In its other position, the dpdt switch feeds the two screen grids from a conventional dedicated B+ supply which is bypassed to ground for true pentode operation.

A comparison can be made between the characteristics of pentode and triode operation: in triode operation, power capability for the vacuum tube pair is reduced approximately 50% and the onset of clip occurs gradually compared to pentode. Interelectrode capacitance between the control grid and the plate is increased dramatically. This reveals a sonic characteristic where harmonics are softened and the sense of sound stage recedes and expands. It can be described as lush and warm.

Meanwhile, in this same amplifier of the present invention, the other two pairs of output tubes are similarly fed from a second dpdt switch wired in a like fashion to provide either triode or pentode operation.

Thus, the two dpdt switches in combination provide the listener an amplifier whose primary power characteristics are incrementally switchable from all triode to all pentode with intermediary positions of one-third pentode and two-thirds pentode.

An additional feature of this improved amplifier is the variable switchability of its negative feedback. A rotary switch offers several (four in the preferred embodiment) increments of negative feedback from zero to maximum. In addition to its primary function as a distortion reduction technique, adding or increasing negative feedback causes the amplifier to exert greater control over a loudspeaker's behavior, forcing it to become both more articulate sounding and more linear with regard to frequency response. These characteristics are not always the sonic virtues they may at first seem to be and most listeners will actually think the sound of an amplifier is improving as the feedback is reduced. One's ability to visualize the soundstage (of the original performance) is usually enhanced as feedback is reduced—up to the point where amplifier non-linearities begin to interfere.

Thus, switchable negative feedback in tandem with the full range of triode/pentode switchability provides an amplifier whose musical performance can be incrementally altered to suit the conditions and the preferences of the listener. Some examples are as follows:

For acoustic chamber music, the settings of zero feedback and all-triode power provide the warmth and intimate delicacy preferred for this type of music. But a small jazz combo with piano, bass, drums and vocalist would likely benefit from the addition of a small amount of negative feedback and the additional power capability of a single pair of pentodes; the musical signals are both more complex and more dynamic.

As the program material becomes increasingly demanding to, for example, a full orchestral symphony, two-thirds pentode and two degrees of negative feedback will likely be preferred for providing greater speaker control and articulation while still rendering the appropriate sound-stage dimensionality and instrumental placement. And for modern electronic pop and rock music, the full resources of all-pentode power coupled with the bass control of full negative feedback may be necessary to provide clarity and tightness at high volumes while preserving the individual identities of each of the layered material voices.

BRIEF DESCRIPTION OF THE DRAWING

The FIGURE is a schematic diagram of a preferred embodiment of the present invention.

DETAILED DESCRIPTION OF THE PREFERRED EMBODIMENT

Figure 1:
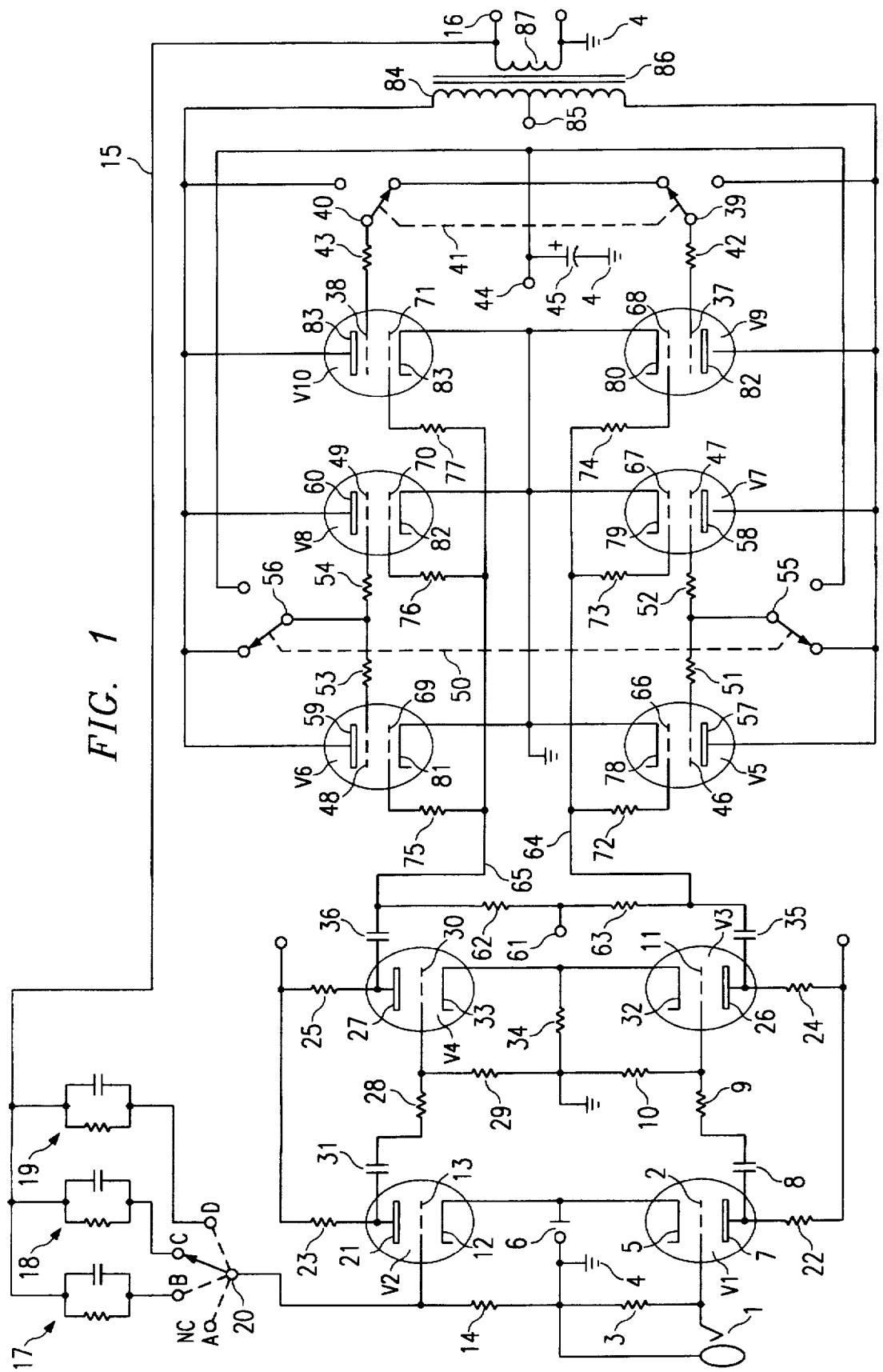

Referring to the FIGURE, an input terminal 1 receives an electronic signal in the form of a voltage from a source such as an electronic instrument, compact disc, magnetic recording tape or the like, which signal voltage is conducted to the grid 2 of triode V1. The grid 2 of triode V1 has a resistor 3 connected to ground 4 to provide a grid leak path. The cathode 5 of triode V1 is connected to ground 4 through a constant current source device 6 which has a high AC resistance but a low DC resistance, thus allowing triode V1 to develop self bias (or cathode bias). Amplified signal is coupled from the plate 7 of triode V1 through blocking capacitor 8 and a voltage divider composed of resistors 9, 10 to grid 11 of triode V3.

Triode V2 operates as a grounded grid, cathode coupled amplifier. Signal from the cathode 5 of triode V1 is directly coupled to cathode 12 of triode V2, the high AC resistance of the current source device 6 preventing this signal from being shunted to ground 4. The grid 13 of triode V2 is held just above ground potential by resistor 14 which also functions as the shunt element of a switchable voltage divider network in the negative feedback path 15. Signal voltage is taken from the output terminal 16 (although in other embodiments the feedback signal may otherwise originate, and there may be a plurality of negative feedback circuits, any one or more of which could be switchable) and is coupled to three different RC networks 17, 18, 19. Switch 20 selects among four positions A, B, C or D which correspond to A, zero negative feedback, B, C and D increasing negative feedback as determined by the values of the respective RC networks 17, 18 and 19.

Output from the plate 21 of triode V2 is composed primarily of amplified, phase reversed signal from the common cathodes 5, and 12 but may also reflect the selectable application of negative feedback applied to its grid 13. A quartet of plate load resistors 22, 23, 24, 25 feed high voltage to the respective plates 7, 21, 26, 27 of respective triodes V1, V2, V3 and V4 and signal amplification is developed across these plate load resistors.

A voltage divider comprising resistors 28 and 29 couple AC signal from the plate 21 of triode V2 to the grid 30 of triode V4. A coupling capacitor 31 blocks DC high voltage. Cathodes 32, and 33 of triodes V3 and V4, respectively, are tied together and connected to ground 4 through biasing resistor 34. Balanced amplitude output signals of opposite phases are coupled from the plates 26 and 27 of triodes V3 and V4, respectively, through a pair of coupling capacitors 35 and 36 and are used to drive the push-pull parallel output pentode pairs V5–V6, V7–V8 and V9–V10.

One of these pentode pairs V9–V10 has its screen grids 37, 38 coupled to the center poles 39, 40 of a double-pole-double-throw switch 41. Resistors 42, 43 tied to the screen grids 37, 38 prevent oscillation by breaking up the resonance with other screen grids in the parallel output circuit. In one position of the switch 41 (as illustrated in the FIGURE), the screen grids 37, 38 are provided continuity with a dedicated screen grid high voltage supply 44 which is bypassed to ground 4 by capacitor 45. Thus the output pentode pair V9–V10 are switched to operate as pentodes.

Two other pairs of output devices, pentode pairs V5–V6 and V7–V8, have their parallel screen grids sharing a second double-pole-double-throw switch 50 which can select pentode or triode screen grid connections for both the pentode pairs V5–V6 and V7–V8. Each of the screen grids 46, 47, 48, 49 utilizes a resistor 51, 52, 53, 54, respectively, to prevent oscillation. Each pair of screen grids 46–47, 48–49 is coupled to a respective pole 55, 56 of the switch 50. When switch 50 is set as shown in the FIGURE, each pair of screen grids 46–47, 48–49 is coupled to its respective pair of plates 57–58, 59–60 and triode operation is obtained. If the switch 50 were set to its alternate position, pentode operation for the output pentode pairs V5–V6 and V7–V8 would ensue as their respective screen grids would instead be coupled to the dedicated and bypassed screen grid high voltage supply 44.

The remainder of the amplifier is wired conventionally. A fixed negative bias supply 61 is coupled through a pair of resistors 62, 63 to grid rails 64, 65. The control grid 66, 67, 68 and 69, 70, 71 of each output device is coupled to its respective grid rail 64, 65 utilizing a small resistor 72, 73, 74, and 75, 76, 77, respectively, to further prevent oscillation in the parallel circuit. The cathode 78, 79, 80, 81, 82 and 83 of each output device is tied to ground 4 and each plate element 57, 58, 59, 60, 82 and 83 is coupled to the primary winding 84 of the output transformer 86. High supply voltage is fed into the center tap 85 of the primary winding 84 of the output transformer 86 whose secondary winding 87 is coupled between ground 4 and the output terminal 16.

It will be understood that this description of a preferred embodiment should not be construed to limit the scope of the invention. Even though this combination of full and individual triode/pentode switchability coupled with adjustable negative feedback has eluded those others who, also skilled in the art, desire an amplifier design with widely variable and switchable characteristics, one can quite easily imagine minor variations which still utilize the essence of this invention. Such deviations would include, but not be limited to, applying the principles disclosed to a single-ended amplifier or to push-pull designs using more or fewer pairs of output devices as two immediate examples. It is therefore the intention that the appended claims be interpreted as broadly as possible in view of the prior art to include all such variations and modifications.

We claim:

1. An amplifying apparatus for electronic audio signals which includes:
    (a) a plurality of electron discharge devices, each of said devices having an anode element, a cathode element, a control grid element, a screen grid element;
    (b) switch means coupled to each of said screen grid elements to selectively provide separately for each said device one of triode or pentode operation; and
    (c) an output coupled to each of said electron discharge devices.

2. The amplifying apparatus of claim 1 wherein said plurality of electron discharge devices comprises a pair of push-pull output devices.

3. The amplifying apparatus of claim 1 wherein said plurality of electron discharge devices comprises a plurality of parallel connected push-pull output devices, each of said plurality of parallel connected push-pull output devices being separately controllable by said switch means.

4. The amplifying apparatus of claim 3 wherein both of the devices of each of said push-pull output devices are simultaneously coupled for the same one of pentode or triode operation.

5. The amplifying apparatus of claim 4 wherein said plurality of parallel connected push-pull output devices comprises at least three such pairs.

6. An amplifying apparatus for electronic audio signals including:
   (a) a first pair of push-pull output power devices, each of said devices of said first pair having a screen grid;
   (b) a second pair of push-pull output power devices connected in parallel with said first pair of push-pull output power devices, each of said devices of said second pair having a screen grid;
   (c) a first switch coupled to said screen grids of said first pair of output power devices for alternate selection of triode or pentode operation; and
   (d) a second switch coupled to said screen grids of said second pair of output power devices alternately selecting triode or pentode operation for said second pair, whereby all combinations of pentode or triode operation are available for said two pairs of output devices, including simultaneous operation as two pairs of triodes, simultaneous operation as two pairs of pentodes, and simultaneous operation of one pair as triodes and a second pair as pentodes.

7. An amplifying apparatus for electronic audio signals as set forth in claim 6 further including a third pair of push-pull output power devices connected in parallel with said first and second pairs of push-pull output power devices, each of said devices of said third pair having a screen grid, said second switch coupled to said screen grids of said third pair of output power devices for alternate selection of triode or pentode operation.

8. An amplifying apparatus for electronic audio signals as set forth in claim 6 further including a third pair of push-pull output power devices connected in parallel with said first and second pairs of push-pull output power devices, each of said devices of said third pair having a screen grid, and a third switch coupled to said screen grids of said third pair of output power devices for alternate selection of triode or pentode operation.

9. The amplifying apparatus of claim 1 further including an input and a feedback path from said output to said input, said feedback path including a switch for alternately selecting one of a plurality of negative feedback settings.

10. The amplifying apparatus of claim 2 further including an input and a feedback path from said output to said input, said feedback path including a switch for alternately selecting one of a plurality of negative feedback settings.

11. The amplifying apparatus of claim 3 further including an input and a feedback path from said output to said input, said feedback path including a switch for alternately selecting one of a plurality of negative feedback settings.

12. The amplifying apparatus of claim 4 further including an input and a feedback path from said output to said input, said feedback path including a switch for alternately selecting one of a plurality of negative feedback settings.

13. The amplifying apparatus of claim 5 further including an input and a feedback path from said output to said input, said feedback path including a switch for alternately selecting one of a plurality of negative feedback settings.

14. The amplifying apparatus of claim 6 further including an input and a feedback path from said output to said input, said feedback path including a switch for alternately selecting one of a plurality of negative feedback settings.

15. The amplifying apparatus of claim 7 further including an input and a feedback path from said output to said input, said feedback path including a switch for alternately selecting one of a plurality of negative feedback settings.

16. The amplifying apparatus of claim 8 further including an input and a feedback path from said output to said input, said feedback path including a switch for alternately selecting one of a plurality of negative feedback settings.

* * * * *